United States Patent
Mann

(10) Patent No.: US 7,745,774 B2
(45) Date of Patent: *Jun. 29, 2010

(54) WIDE DYNAMIC RANGE IMAGE SENSOR

(75) Inventor: Richard A. Mann, Torrance, CA (US)

(73) Assignee: ESS Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/157,098

(22) Filed: Jun. 7, 2008

(65) Prior Publication Data

US 2008/0237451 A1    Oct. 2, 2008

Related U.S. Application Data

(63) Continuation of application No. 11/592,416, filed on Nov. 3, 2006, now Pat. No. 7,411,169.

(60) Provisional application No. 60/800,129, filed on May 12, 2006.

(51) Int. Cl.
*H01L 27/00* (2006.01)
*H04N 5/335* (2006.01)

(52) U.S. Cl. ............... 250/208.1; 348/297; 348/308
(58) Field of Classification Search ............ 250/208.1; 348/294, 297, 308; 257/E27.131
See application file for complete search history.

(56) References Cited

U.S. PATENT DOCUMENTS

| | | | | |
|---|---|---|---|---|
| 6,130,713 | A * | 10/2000 | Merrill | 348/308 |
| 7,411,169 | B2 * | 8/2008 | Mann | 250/208.1 |
| 2003/0058356 | A1 * | 3/2003 | DiCarlo et al. | 348/241 |
| 2005/0128327 | A1 * | 6/2005 | Bencuya et al. | 348/308 |

* cited by examiner

*Primary Examiner*—John R Lee
(74) *Attorney, Agent, or Firm*—Farjami & Farjami LLP

(57) ABSTRACT

An exemplary image sensor comprises a photodetector proximate to a pixel site, and a light meter proximate to the pixel site configured to approximate an initial charge acquired by the photodetector at the end of a first integration period of a frame exposure period. A reset circuit resets the photodetector if the approximated initial charge acquired by the photodetector exceeds a threshold. A readout circuit detects a final charge acquired by the photodetector at the end of a second integration period of the frame exposure period. If the photodetector was reset, the readout circuit adjusts the final exposure to account for exposure prior to the photodetector having been reset.

18 Claims, 3 Drawing Sheets

WIDE DYNAMIC RANGE IMAGE SENSOR

This is a continuation of application Ser. No. 11/592,416, Filed on Nov. 3, 2006.

The present application claims the benefit of and priority to a pending provisional patent application entitled "Wide Dynamic Range CMOS Image Sensor Circuit and Method of Use," Ser. No. 60/800,129 filed on May 12, 2006. The disclosure in that pending provisional application is hereby incorporated fully by reference into the present application.

BACKGROUND OF THE INVENTION

1. Field of the Invention

The present invention is generally in the field of imaging devices. More specifically, the invention is in the field of imaging devices having improved dynamic range.

2. Background Art

Image sensors have broad applications in many areas. Image sensors convert a received image into representative information indicative of the received image. Examples of image sensors include solid-state image sensors, such as charge coupled devices (CCDs) and CMOS imaging devices (also known as CMOS image sensors), among others.

Image sensors are fabricated from semiconductor materials and comprise imaging arrays of light detecting, i.e., photosensitive, elements (also known as photodetectors) interconnected to generate representative information (e.g., analog signals) that corresponds to an image illuminating the device. A typical imaging array comprises a number of photodetectors arranged in a pattern, for example, a pattern comprising rows and columns. Each photodetector in the imaging array receives a portion of the light reflected from an object and received by the image sensor. Each portion is called a picture element and is typically referred to as a pixel. Each pixel provides output information representative of the luminance and/or chrominance detected by the photodetector. When considered in the context of the pattern of the photodetectors, the output information from the pixels constitutes the representative information that corresponds to the image incident upon the imaging array.

As an example, each pixel of an imaging array may provide as output information an output signal, which may, for example, be dependent upon an accumulation of charge, i.e., photo charges, according to the photoelectric effect, corresponding to the radiation intensity falling upon its detecting area defined by the physical dimensions of its corresponding photodetector. The photo charges from each pixel are converted to a charge signal, which is an electrical potential representative of the luminance and/or chrominance reflected from a respective portion of the object and received by the image sensor. The resulting charge signal or potential is read and processed by video/image processing circuitry to create a signal representation of the image.

It has been difficult to provide simultaneously wide dynamic range and very low noise in image sensor arrays. Present trends towards small pixel pitches in CMOS four-transistor (4T) technology result in loss of charge capacity as the pixel shrinks. This results in imagers with only 56 dB or less of dynamic range. This low dynamic range degrades the quality of outdoor images because there is simply not enough range in the sensor photodiode to describe both the bright and dark areas of the scene.

A conventional CMOS image sensor is typically structured as an imaging array of photodetectors, each photodetector being reset to an approximately known potential after the readout of a previous image, and in preparation for the next image. However, the performance of conventional CMOS image sensors suffers from a number of problems. For example, conventional CMOS image sensors suffer from noise associated with the process for resetting the photodiode in each pixel to a known potential after each exposure and in preparation for the next image. This noise, also referred to as reset noise or KTC noise, is often a significant source of noise in camera systems employing conventional CMOS image sensors. The reset noise is proportional to the square root of KTC, where C is the capacitance of the sense node or photodiode/source follower gate combination in a typical active pixel sensor. Reset noise is typically 30 to 40 electrons one-sigma. Reducing the capacitance of the sense node can reduce reset noise, but results in a corresponding reduction in the total charge that can be collected and therefore undesirably reduces the overall dynamic range in the camera system.

Moreover, the trend towards small pixel pitches in image sensors results in additional loss of charge capacity, further reducing dynamic range. Low dynamic range significantly degrades image quality, particularly in outdoor images, due to the limited range of the sensor's photodetector and its inability to describe both bright and dark areas of the scene in a single frame exposure.

One approach for increasing dynamic range in image sensors involves acquiring both a short exposure and a long exposure separately, each exposure stored in respective frame buffers, the short exposure being suitable for capturing bright areas of a scene, and the long exposure being suitable for capturing the dark areas of the scene. Thereafter, the image stored into the short exposure frame buffer and the image stored into the long exposure frame buffer could be integrated into a single image with improved dynamic range. However, the significantly increased costs associated with additional frame buffers renders this approach impractical for many applications.

Three-transistor (3T) pixels can be constructed with large capacities (e.g., 15,000 to 35,000 photons or more), but the higher noise floor of 25 to 35 electrons (converted photons) results in a dynamic range of 60 dB at best. However, in low light situations, the higher noise floor and higher dark current of the 3T pixel result in greatly degraded performance compared to 4T pixels.

In higher cost systems, such as those used for security applications, very high dynamic range images can be compounded by collecting multiple full-frame images and different exposures. These outputs are stored in a full-frame memory buffer and a very high dynamic image is created by software. However, the required buffer memory cost is comparable to the cost of the image sensor, and this cost is not easily borne by low-end consumer applications, such as cellular phone cameras. However, in higher end camera phones, substantial improvements in overall performance can be enabled by the use of a frame buffer in the camera.

Four-transistor (4T) pixels with pitches of about 2.25 micron to 2.8 micron struggle to have 6000 electrons of capacity while maintaining a noise floor of about 10 electrons. This lower noise floor results and the lack of significant dark signal noise results in three to four times improvement in low light performance when compared to 3T technology. However, the total dynamic range remains at 56 dB, and outdoor images are inferior to larger pixel cameras.

What is needed is a low cost solution that retains the low light performance and small form factor of the small pixel pitch but has a substantial (e.g., 2×) improvement in dynamic range for outdoor images. Accordingly, there is a strong need in the art for a cost-effective wide dynamic range image sensor.

SUMMARY OF THE INVENTION

The present invention is directed to a wide dynamic range image sensor and method of use. In one exemplary embodiment, the image sensor comprises a photodetector proximate to a pixel site, and a light meter proximate to the pixel site configured to approximate an initial charge acquired by the photodetector at the end of a first integration period of a frame exposure period. For example, the first integration period may be about half of the frame exposure period. In one embodiment, a plurality of photodetectors are provided at a pixel site of the image sensor, such that a first photodetector, a second photodetector, a third photodetector, and a fourth photodetector are in a Bayer pattern. A Bayer pattern is an arrangement of photodetectors having varying sensitivity to luminance and chrominance in proximity to one another. For example, a rectangular area may be divided into four quadrants, with one quadrant configured as a red-sensitive photodetector, one quadrant configured as a blue-sensitive photodetector, and two (preferably diagonally opposite) quadrants configured as green-sensitive photodetectors.

A reset circuit resets the photodetector if the approximated initial exposure of (e.g., charge acquired by) the photodetector at the end of a first integration period of a frame exposure period exceeds a threshold. A readout circuit is configured to detect a final exposure of (e.g., charge acquired by) the photodetector at the end of a second integration period of the frame exposure period. If the photodetector was reset, the readout circuit is configured to adjust the final exposure, for example, by increasing the final exposure by a predetermined factor, such as by a factor of two. In one embodiment, the light meter comprises a supplemental photodetector proximate to the pixel site. The supplemental photodetector may also be configured to store information indicative of the photodetector having been reset. In another embodiment, a sense node coupled to the photodetector through a transfer transistor functions as a light meter.

As described more fully below, an innovative image sensor is provided that has significantly wider dynamic range, yielding a more accurate image acquisition operation, ultimately resulting in an improved final image quality. Other features and advantages of the present invention will become more readily apparent to those of ordinary skill in the art after reviewing the following detailed description and accompanying drawings.

DETAILED DESCRIPTION OF THE INVENTION

Figure 1:
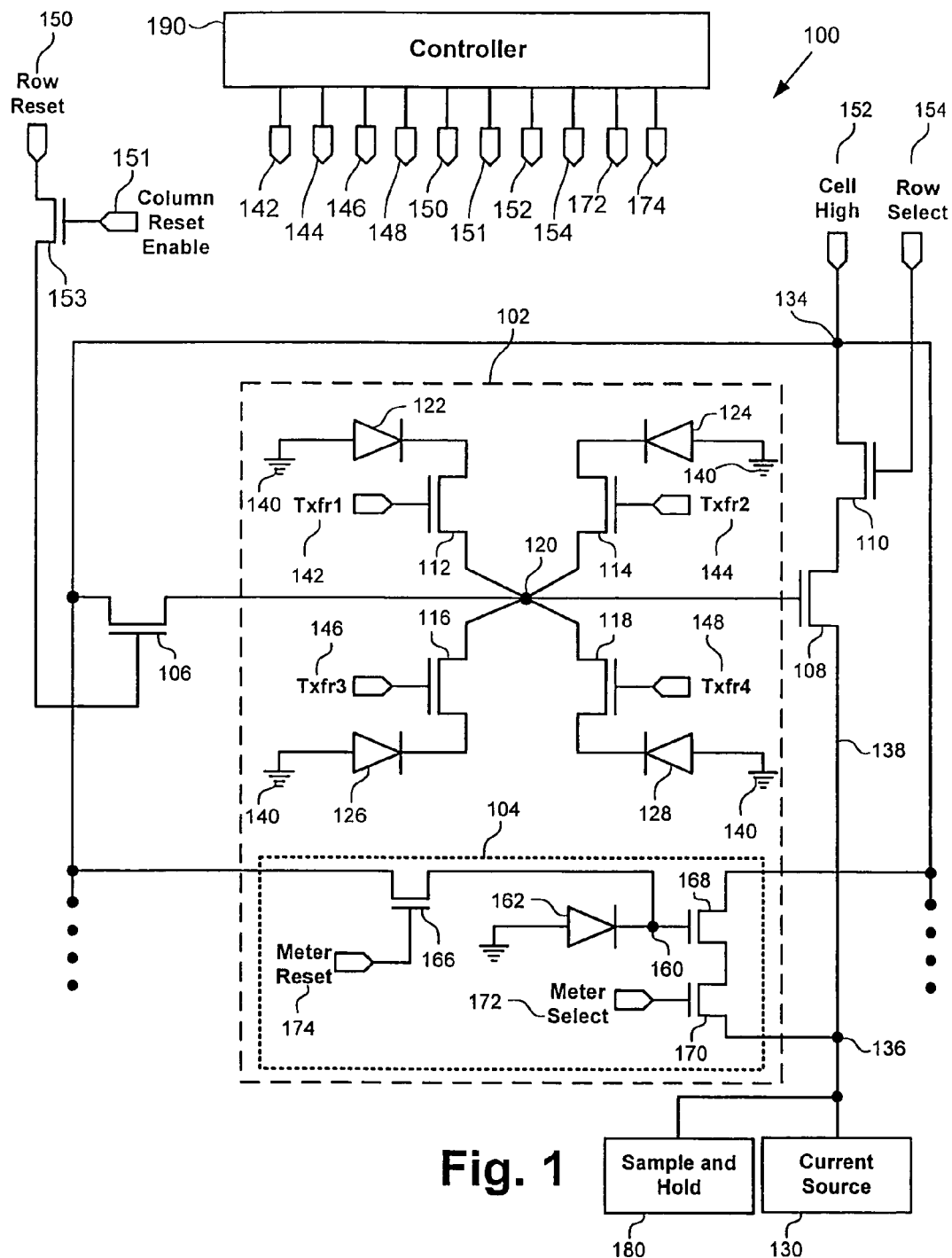
FIG. 1 illustrates an exemplary image sensor circuit according to one embodiment of the present invention.

The present invention is directed to a wide dynamic range image sensor and method of use. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It is noted that, for ease of illustration, the various elements and dimensions shown in the drawings are not drawn to scale.

By way of overview, according to the present invention, a camera system (e.g., a CMOS camera system) can be adapted to capture images with two integration times for a single frame. The supporting or integrated pixel processing chain combines the two embedded images into a single image with a total dynamic range which can be approximately equivalent to a dynamic range of a pixel with a photon capacity that is double that of the actual pixel. For example, a typical 4T pixel with 6000 electron capacity would render an image equivalent to 12000 electron capacity for a maximum dynamic range of 62 dB, providing an improvement of 6 dB.

Such an increase in dynamic range can be accomplished through the use of a novel pixel and readout approach for shared pixels. Image information is collected by four pixels using a common sense node. During outdoor exposures an overall integration time for the frame that is longer than that which the pixel capacity will support is selected. Without additional action this would result in only the image features in shadow being correctly exposed, while the image features in bright light (e.g., sunlight) would be overexposed.

After some portion of time during the exposure less than that needed for the brightest pixels to reach capacity, a rapid read operation is performed to examine the amount of exposure of a pixel. Such a rapid read operation may be performed by reading an extra pixel element. The extra pixel element may be either a fifth pixel element explicitly fabricated for use as a light meter or an existing circuit feature that exhibits a photosensitive property. The preferred method is to read a fifth pixel element.

The fifth pixel element can be, for example, a conventional 3T photodetector which is associated with a shared cluster of four pixels, where each pixel can be, for example, a 4T pixel. The fifth pixel element can be read and reset. The fifth pixel element may be a very small 3T pixel as there are no constraints or concerns about pixel fixed pattern noise. The light response level of the fifth pixel element can be tuned by using light shields to insure it is not too responsive. The 3T fifth pixel element is reset to a high voltage at the start of frame integration. After the completion of a portion (e.g., one half) of the total integration time, the fifth pixel element is read. This rapid read out may be accomplished by a column analog-to-digital-converter (ADC) comparator, and each pixel in each row is compared to a preset value. Pixels whose sense node voltage has decreased below the preset value have been exposed to bright light and would become over filled and useless to the final image if integration were to continue to the full extended exposure time (e.g., twice the normal exposure time). When the column ADC recognizes the depleted condition (i.e., exposure to bright light) of the sense node in the fifth pixel element for this shared pixel cluster of four 4T photodiodes, a logic latch is set in the column read out circuits. This depleted state signal is thus recorded on a line-by-line basis. This column stored information is used to then reset the each depleted pixel in this row immediately subsequent to the sense node read operation. A record of this reset event may be stored in the pixel by writing or resetting the fifth pixel element to a recognizable value, such as a very low voltage.

Another method is to poll or read the sense node. The shared sense node is exposed to light, and its voltage drops in proportion to the light collection in the local area. The sense node voltage will drop rapidly when the local pixels become over saturated. The transfer gates for all four regular photodetectors remain closed during this read operation and only the charge remaining on the common sense node is polled. This rapid read out is accomplished by a column ADC comparator, and each pixel in each row is compared to a preset value. Pixels whose sense node voltage has decreased below the preset value have been exposed to bright light and would become over filled and useless to the final image if integration were to continue for the full exposure duration (e.g., twice the normal exposure duration). When the column ADC recognizes the depleted condition of the sense node for these shared pixel clusters in bright light, a logic latch is set in the column read out circuits. This depleted state signal is thus recorded on a line-by-line basis. This column stored information is used to then reset the each depleted pixel in this row immediately subsequent to the sense node read operation. A record of this reset event may be stored in an element capable of storing state information, such as in the pixel by writing or resetting the fifth pixel element to recognizable value, such as a very low voltage, or in a memory cell.

The pixel will contain a state information storage element, such as a fifth pixel element or a memory cell that may be integrated with the image sensor or in a separate memory device. The element capable of storing state information is preferably reset or state changed only at the intermediate exposure point before the full extended exposure time for the frame elapses. When the final image is read the state of the state information storage element is also read. The fifth pixel element is a small third row of pixels which is associated both physically and logically with each Bayer pattern set of conventional pixels (e.g., one conventional pixel or two conventional pixels). The state of the fifth pixel element tells the pixel processing chain that the associated shared imaging pixels were reset at the intermediate exposure point, indicating that the values are to be scaled accordingly (e.g., 2×) in the final image representation. (This state can be appended to the "bits for the pixel" as an added bit in the column circuits during read out.) The fifth pixel element is a simple diode storage node which is reset high (or low, simple differential state) when the associated four imaging pixels are selected for restart of integration at an intermediate time.

A second method to determine whether an intermediate reset was applied is to again poll the shared sense node at the end of integration time for the entire frame. For example, by determining the response of the shared sense node to illumination, appropriate thresholds may be set for comparing the polling of the shared sense node to determine whether an intermediate reset was applied.

A rapid read of the fifth pixel element is used to compare to a fixed value before the frame exposure is complete. This is best and most easily accomplished by a column ADC approach. In addition, the column circuits or a column mapped memory is used to remember the results, and a decision based on this sampling of the light meter pixel is used to instruct which pixels should be reset to insure maximum dynamic range. Also, the vertical scanner module is adapted to accommodate the provision of a variable reset voltage to each set of three rows. An additional dummy row is preferably added to the system to maintain balance of analog loads. This dummy row is reset for all pixels column address that are not reset in the active rows during the same reset operation, thereby keeping loading on the analog circuits constant.

The ratio of the amount of area occupied by light meter photodetectors to the amount of area occupied by imaging photodetectors can be selected to optimize performance. As more area is devoted to light meter photodetectors, the number of photodetectors can be increased, which can increase the granularity with which information from the light meter photodetectors can be applied to nearby imaging photodetectors. As less area is devoted to light meter photodetectors, a larger proportion of the area is occupied by imaging photodetectors, which can minimize aliasing.

Referring to FIG. 1, there is shown exemplary CMOS image sensor circuit 100 including pixel site area 102 and light meter 104 in accordance with one embodiment of the present invention. CMOS image sensor circuit 100 may be employed in imaging devices for use in a variety of applications. As discussed below, CMOS image sensor circuit 100 is configured to acquire an image with significantly improved dynamic range, resulting in significantly improved image quality.

Figure 3:
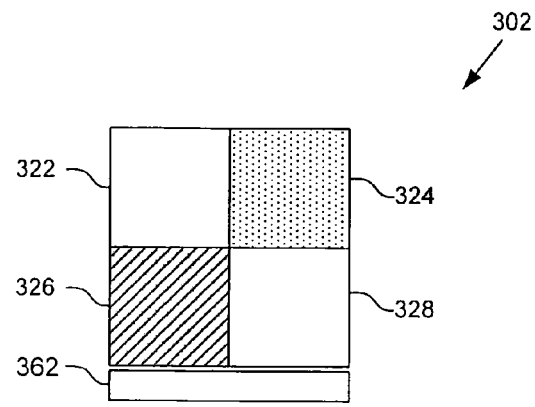
FIG. 3 illustrates an exemplary pixel site arranged in a Bayer pattern according to one embodiment of the present invention.

In FIG. 1, CMOS image sensor circuit 100 is configured to control and read photodetectors, such as photodiodes 122, 124, 126 and 128 of pixel site area 102, although other types of photodetectors may also be used with the present invention. Each photodiode 122, 124, 126 and 128 is associated with a corresponding pixel in an imaging array of an imaging device. For example, FIG. 3 illustrates pixel site area 302 sub-divided and arranged in a Bayer pattern, including green element areas 322 and 328, blue element area 324 and red element area 326. FIG. 3 also illustrates a light meter area 362, proximate to green element areas 322 and 328, blue element area 324, and red element area 326.

In an embodiment, where pixel site area 102 of FIG. 1 is configured as pixel site area 302 of FIG. 3, photodiodes 122 and 128 can be used to capture the image scene falling at pixel element areas 322 and 328, respectively, of Bayer patter 302. Likewise, photodiode 126 can be used to capture the image scene falling at pixel element area 326, and photodiode 128 can be used to capture the image scene falling at pixel element area 328. Various demosaicing algorithms can be used to interpolate a set of complete red, green, and blue values for each of pixel element areas 322, 324, 326 and 328 as is known in the art.

Also, photo diode 162 can be used as a fifth photodetector to measure light incident on light meter area 362. Since light meter area 362 is located in proximity to green element areas 322 and 328, blue element area 324, and red element area 326, light incident on light meter area 362 is also indicative of light incident on green element areas 322 and 328, blue element area 324, and red element area 326. Thus, photodiode 162 can be used to control exposure of green element areas 322 and 328, blue element area 324, and red element 326.

Photodiodes 122, 124, 126 and 128 are shown in FIG. 1 and described herein for illustrative purposes only to describe pixel area 102, and a typical imaging array comprises a larger number of photodiodes and pixels. As shown in FIG. 1, each photodiode 122, 124, 126 and 128 is connected across ground 140 and shared sense node 120 by respective transfer transistor 112, 114, 116 and 118.

Reset transistor 106, source follower transistor 108 and select transistor 110 provide control and readout of CMOS image sensor circuit 100, as described more fully below. Each of transfer transistor 112, 114, 116 and 118, reset transistor 106, source follower transistor 108 and select transistor 110 can, for example, comprise an N-channel FET (NFET). The drain of reset transistor 106 is tied to the drain of select transistor 110 at node 134, and the source of reset transistor 106 is connected to the gate of source follower transistor 108 at shared sense node 120. The drain of source follower transistor 108 is connected to the source of select transistor 110, and the source of source follower transistor 108 is coupled at node 136 to current source 130 and sample and hold circuit 180 via column bus 138.

Light meter 104 comprises a three-transistor (3T) pixel arrangement including supplemental photodiode 162, although other types of photodetectors may also be used with the present invention. Light meter 104 includes light meter reset transistor 166, light meter source follower transistor 168 and light meter select transistor 170 to provide control and readout of light meter 104, as described more fully below. Each of light meter reset transistor 166, light meter source follower transistor 168 and light meter select transistor 170 can, for example, comprise an NFET.

Photodiode 162 is connected across ground 140 and the gate of light meter source follower transistor 168 at sense node 160. The source of light meter reset transistor 166 is also tied to sense node 160, and the drain of light meter reset transistor 166 is coupled at node 134 to the drain of light meter source follower transistor 168. The drain of light meter select transistor 170 is tied to the source of light meter source follower transistor 168, and the source of light meter select transistor 170 is coupled at node 136 to current source 130.

A controller 190 provides control and timing signals to each of transfer transistors 112, 114, 116 and 118, reset transistor 106, source follower transistor 108, select transistor 110, light meter reset transistor 166, light meter source follower transistor 168 and light meter select transistor 170. More particularly, a cell high signal 152 is supplied to node 134, a row reset signal 150 is supplied to the gate of reset transistor 106, a column reset enable signal 151 is supplied to the gate of column reset enable transistor 153, a row select signal 154 is supplied to the gate of select transistor 110, a transfer signal 1 (Txfr1) 142 is supplied to the gate of transfer transistor 112, a transfer signal 2 (Txfr2) 144 is supplied to the gate of transfer transistor 114, a transfer signal 3 (Txfr3) 146 is supplied to the gate of transfer transistor 116, a transfer signal 4 (Txfr4) 148 is supplied to the gate of transfer transistor 118, a meter select signal 172 is supplied to the gate of light meter select transistor 170, and a meter reset signal 174 is supplied to the gate of light meter reset transistor 166.

In accordance with at least one embodiment, a controller is coupled to the photodetector and to the light meter. The controller is configured to cause an evaluation of an initial exposure of the photodetector during a first integration period of a frame exposure period. The controller is further configured to cause a selective modification of the initial exposure of the photodetector prior to a second integration period of the frame exposure period dependent upon the evaluation. The controller is also configured to cause a final exposure of the photodetector to be adjusted dependent upon the selective modification.

In at least one embodiment, the selective modification comprises resetting the photodetector. In at least one embodiment, an indication of the selective modification is stored in a memory cell. In at least one embodiment, the light meter comprises a three transistor photodetector circuit. In at least one embodiment, the light meter comprises a four transistor photodetector circuit. In at least one embodiment, the light meter comprises a sense node coupled to the photodetector via a transfer transistor.

In at least one embodiment, the controller is configured to cause a second evaluation of a second exposure of the photodetector during the second integration period of the frame exposure period. The controller is further configured to cause a second selective modification of the second exposure of the photodetector prior to a third integration period of the frame exposure period dependent upon the second evaluation. The controller is also configured to cause a final exposure of the photodetector to be adjusted dependent upon the second selective modification.

Figure 2:
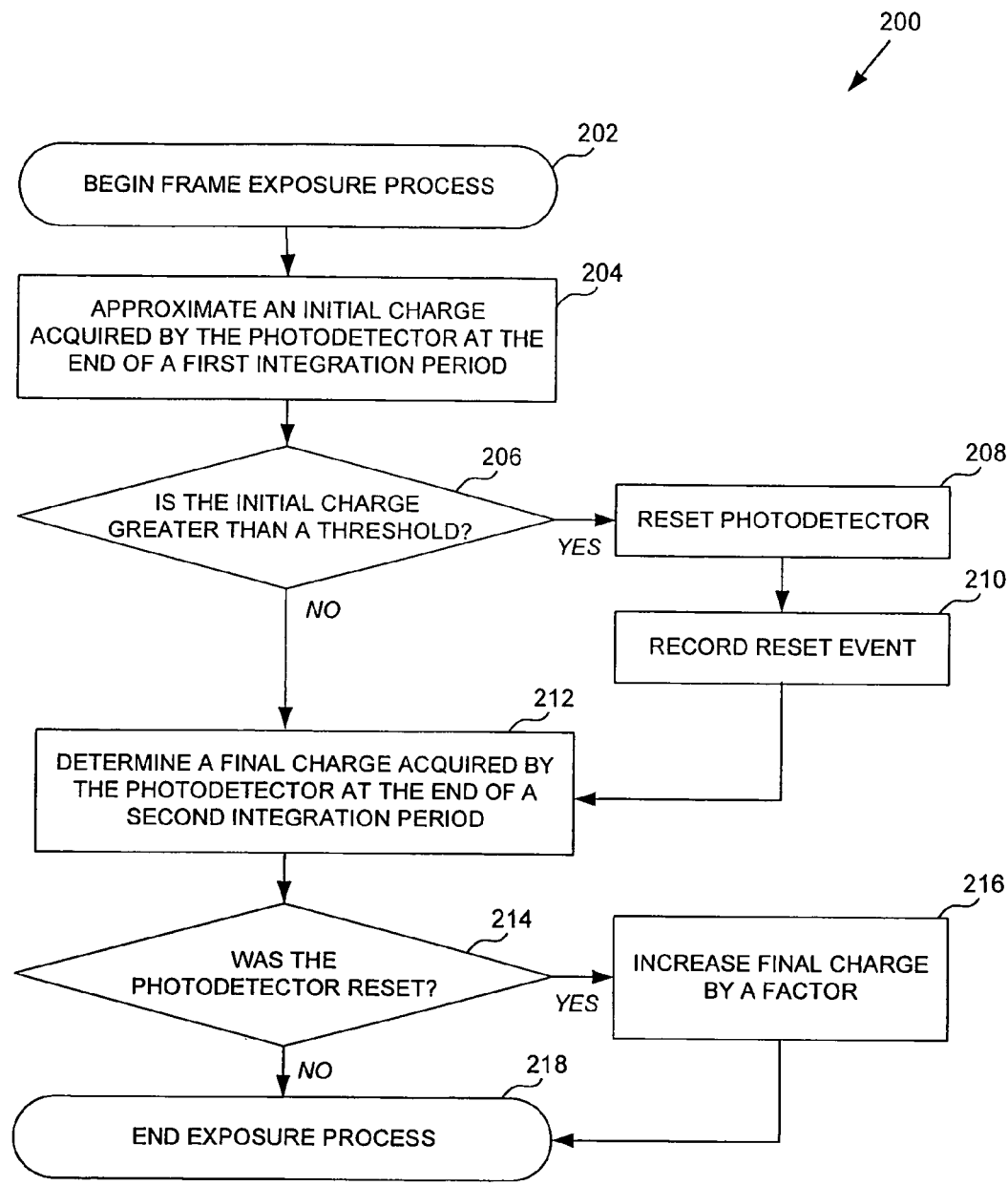
FIG. 2 illustrates a flow chart for operating the image sensor circuit of FIG. 1 according to one embodiment of the present invention.

Referring now to FIG. 2, an exemplary method for operating an image sensor, such as CMOS image sensor circuit 100 of FIG. 1, will be described in relation to flow chart 200. Flow chart 200 illustrates one technique for acquiring an image at pixel site area 102 of image sensor circuit 100 of FIG. 1 during a frame exposure period. Certain details have been left out of flow chart 200 of FIG. 2 that are apparent to a person of ordinary skill in the art. For example, a step may consist of one or more sub-steps. While steps 202 through 218 shown in flow chart 200 are sufficient to describe one embodiment of the present invention, other embodiments of the invention may utilize step different from those shown in flow chart 200. As described above, a typical imaging array comprises a larger number of photodiodes and pixels, and the technique illustrated in flow chart 200 and described below can be applied to processing a plurality of pixel areas, typically in rows of pixels.

At step 202, a command to begin an image capture is received, e.g., from a user, and the exposure process is initiated. In the method of flow chart 200, the frame exposure period is subdivided into a first integration period and a second integration period. In other embodiments, additional integration periods can also be implemented to provide finer granularity and possibly wider dynamic range. In the present example, the first integration period is approximately half of the exposure period. Typically, each of photodiodes 122, 124, 126 and 128 and light meter photodiode 162 are reset to a known potential (reference charge level) prior to the initial integration period. For example, photodiodes 122, 124, 126 and 128 are reset by enabling reset transistor 106 and each of transfer transistors 112, 114, 126 and 128. Similarly, photodiode 162 is reset by activating light meter reset transistor 166.

At step 204, an initial charge acquired by photodiodes 122, 124, 126 and 128 at pixel site area 102 are approximated at the end of the first integration period. Since 3T pixel light meter 104 is situated proximate to pixel site area 102, this initial charge approximation can be determined by detecting the charge acquired by photodiode 162 of light meter 104 at the end of the first integration period. In light meter 104, the potential of photodiode 162 can be transferred to column bus 138 and sample and hold circuit 180 by supplying meter select 172 to the gate of light meter select transistor 170 and activating light meter select transistor 170.

Alternatively, the initial charge approximation can be determined by sampling the potential at shared sense node 120 since the interface between sense node 120 and transistors 112, 114, 116 and 118 forms an N-P junction, effectively functioning as a photodiode, and usable as a light meter. In this particular embodiment, sense node 120 functions as a light meter, and 3T pixel light meter 104 can be omitted from CMOS image circuit 100. The potential at shared sense node 120 can be transferred to column bus 138 and sample and hold circuit 180 by supplying row select 154 to the gate of row select transistor 110 and activating it to provide voltage/current to the drain of source follower transistor 108, such that transistor 108 can function as a source follower and can transfer a voltage proportional to the voltage at the gate of transistor 108, i.e. the voltage at shared sense node 120, to column bus 138.

The charge transferred from the light meter to column bus 138 is sampled and processed by sample and hold circuit 180 coupled to column bus 138 to determine an approximate initial charge acquired by photodiodes 122, 124, 126 and 128 at pixel site area 102. Since the light meter used to approximate the initial charge acquired by photodiodes 122, 124, 126 and 128 may be a photodetector having a capacity different from that of photodiodes 122, 124, 126 and 128, appropriate adjustment, mapping or scaling may be required in order to accurately correlate the light meter reading from the light meter with the actual initial charge acquired by photodiodes 122, 124, 126 and 128.

At step 206, a determination is made as to whether the initial charge determined at step 204 exceeds a threshold. This threshold is typically exceeded in areas of a scene that are bright. Conversely, the threshold is typically not exceeded in dark areas of a scene. For example, the threshold may be selected such that the threshold with be exceeded during the first integration period if the capacity of the photodetectors of the pixel would be exceeded, but for resetting the photodetectors, during the frame exposure period. In the particular embodiment where the first integration period is approximately half of the exposure period, the threshold can be set to a value that corresponds with a determination that at least half of the charge capacity of photodiodes 122, 124, 126 and 128 has been depleted as a result of image acquisition during the first integration period. By way of illustration, if each of photodiodes 122, 124, 126 and 128 has a 10,000 electron charge capacity, the threshold can be set to an electron charge value corresponding to approximately 5,000. In other embodiments, the threshold value can be set differently, such as a value that corresponds with a determination that at least one-third of the charge capacity of photodiodes 122, 124, 126 and 128 has been consumed, for example. If, at step 206, the initial charge capacity exceeds the threshold, each of photodiodes 122, 124, 126 and 128 are reset at step 208. If the initial charge capacity does not exceeds the threshold, flow chart 200 skips reset step 208, thereby accurately describing dark areas of a scene, and continues to step 212.

At step 208, photodiodes 122, 124, 126 and 128 are reset. The reset event of step 208 provides a level of protection against over-saturation of photodiodes 122, 124, 126 and 128, e.g., when acquiring a bright area of a scene. Since pixels are commonly reset in entire rows in a typical image sensor, a column reset enable transistor 153 operating as a switch may be provided between row reset signal 150 and the gate of reset transistor 106 to selectively reset a particular column of a row during the reset event of step 208. In certain embodiments, row reset events are executed in pairs of rows, i.e., two rows at a time. In these particular embodiments, protection against analog device imbalance can be provided during the reset event of step 208 by way of a placeholder or "dummy" row. Imbalances may occur as a result of differences in the number of pixels to be reset between two rows. Providing a dummy row as a placeholder element (to be reset) allows the two-row reset process to be symmetrical and balanced despite the differences in the number of pixels to be reset between two rows.

At step 210, the reset event of step 208 is recorded. In the embodiment depicted in FIG. 1 employing 3T pixel light meter 104, the reset event can be stored by photodiode 162, e.g., by charging photodiode 162 to a known voltage clearly indicative of a reset event. In the embodiment where sense node 120 functions as the light meter, the reset event can be recorded in a storage latch.

At step 212, a final charge acquired by photodiodes 122, 124, 126 and 128 at pixel site area 102 are determined at the end of the second integration period. In the example where the exposure period is sub-divided into two integration periods (first and second), the end of the second integration period coincides with the end of the frame exposure period. In the embodiment shown in FIG. 1, this detection can be carried out by activating row select transistor 110 and serially transferring the charge acquired by photodiodes 122, 124, 126 and 128 by serially selecting transfer transistors 112, 114, 126 and 128, respectively. The charge acquired by each of photodiodes 122, 124, 126 and 128 are thereby serially transferred to shared sense node 120 and subsequently processed along column bus 138.

At step 214, a determination is made as to whether photodiodes 122, 124, 126 and 128 were reset at step 208. As described above, this reset event is recorded at step 210 and is typically carried out for pixels in bright areas of a scene. If photodiodes 122, 124, 126 and 128 were reset, then step 216 is carried out; otherwise, flow chart 200 continues to step 218.

At step 216, the final charge determined during step 212 is increased by a predetermined factor. For example, the value corresponding to the final charge capacity can be doubled. At step 218, the exposure process is completed.

This increase in the final charge during step 216 accounts for the reset event of step 208. Advantageously, the technique described by flow chart 200 avoids over-saturation of the photodetectors in bright areas of a scene and yet maintains accurate image acquisition of dark areas. Beneficially, a more accurate measure of the light acquired by photodiodes 122, 124, 126 and 128 is achieved, and the dynamic range of the image sensor is effectively doubled without the high cost of redundant image buffers.

Figure 4:
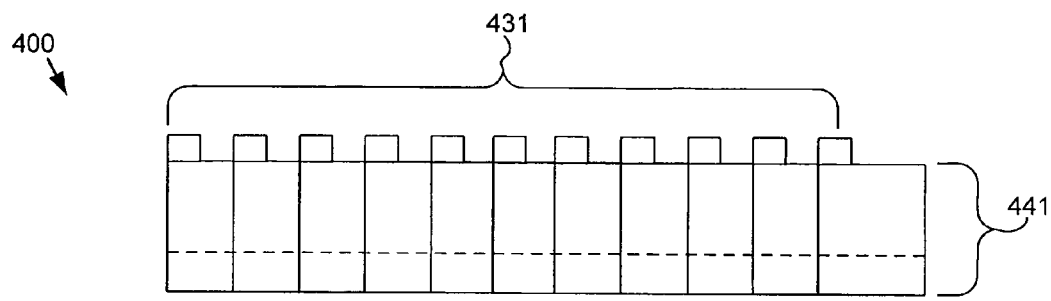
FIG. 4 is a block diagram illustrating an apparatus in accordance with at least one embodiment.
Figure 4:
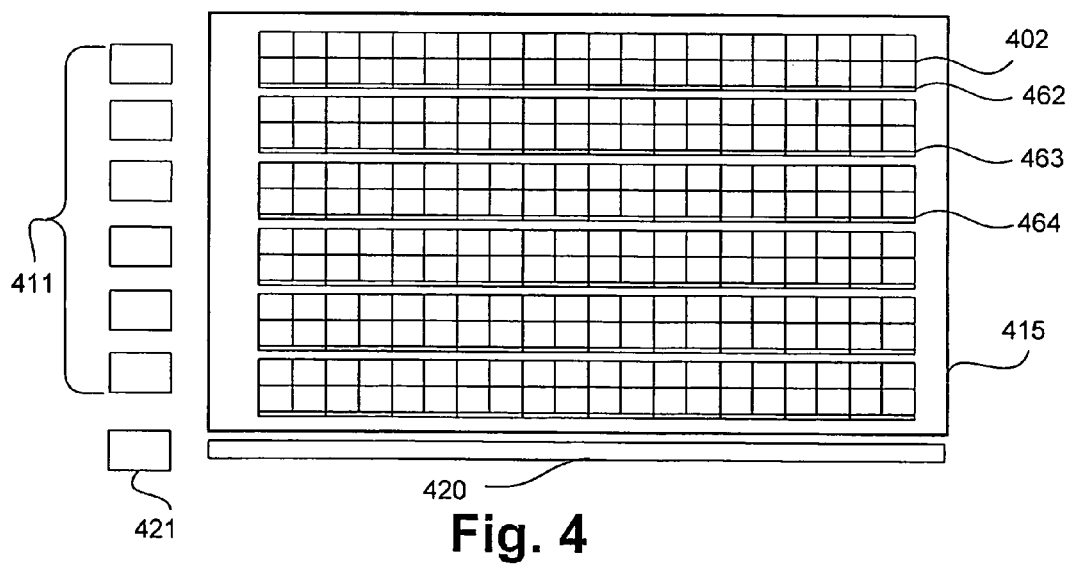

FIG. 4 is a block diagram illustrating apparatus 400 in accordance with at least one embodiment. Apparatus 400 comprises a photodetector array 415, column ADC circuits and control logic 441, storage latches 431, vertical scanner circuits 411, "dummy" row 420, and vertical scanner 421 for "dummy" row 420. Photodetector array 415 comprises pixel sites, such as pixel site 402, preferably arranged in Bayer patterns, as depicted in FIG. 3. In accordance with at least one embodiment, the pixel sites comprise a light meter. For example, pixel site 402 is shown as comprising light meter 462. Other examples of light meters for other pixel sites include light meters 463 and 464. The elements in each row of photodetector array 415 are duplicated in "dummy" row 420. For example, if pixel site 402 comprises light meter 462, "dummy" row 420 would also comprise a "dummy" light meter, allowing all actions that would be undertaken with respect to photodetector array 415 to be able to be undertaken with respect to "dummy" row 420. In accordance with at least one embodiment, storage latches 431 can be used store information indicating whether photodetectors were subject to an intermediate reset, in a manner described above in relation to FIGS. 1 and 2. Apparatus 400 is thus one embodiment where the present invention as described in FIGS. 1 and 2 above can be practiced.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a wide dynamic range image sensor and method of use have been described.

The invention claimed is:

1. An image sensor circuit comprising:
a photodetector proximate to a pixel site;
a light meter proximate to said pixel site configured to approximate initial exposure of said photodetector;
a reset circuit configured to reset said photodetector if said initial exposure exceeds a threshold;
a readout circuit configured to detect a final exposure of said photodetector, said readout circuit further configured to adjust said final exposure if said photodetector was reset.

2. The image sensor circuit of claim 1 wherein said light meter is further configured to approximate said initial exposure of aid photodetector at an end of a first integration period of a frame exposure period.

3. The image sensor circuit of claim 1 wherein said readout circuit is further configured to detect said final exposure of said photodetector atm end of a second integration period of a frame exposure period.

4. The image sensor circuit of claim 1, wherein said light meter comprises a supplemental photodetector proximate to said pixel site.

5. The image sensor circuit of claim 1, wherein said supplemental photodetector is configured to store information indicative of said photodetector having been reset.

6. The image sensor circuit of claim 1, wherein said light meter comprises a sense node coupled to said photodetector.

7. The image sensor circuit of claim 2, wherein said first integration period is approximately half of said frame exposure period.

8. The image sensor circuit of claim 1, wherein said photodetector comprises a plurality of photodetectors including a first photodetector, a second photodetector, a third photodetector, and a fourth photodetector, wherein said first, second, third and fourth photodetectors are arranged in a Bayer pattern.

9. An apparatus comprising:
a photodetector proximate to a pixel site of an image sensor;
a light meter proximate to said pixel site;
a controller coupled to said photodetector and to said light meter, said controller configured to cause an evaluation of an initial exposure of said photodetector, said controller further configured to cause a selective modification of said initial exposure of said photodetector, said controller further configured to cause a final exposure of the photodetector to be adjusted dependent upon said selective modification.

10. The apparatus of claim 9, wherein said controller is further configured to cause said evaluation of said initial exposure during a first integration period of a frame exposure period.

11. The apparatus of claim 9, wherein said controller is further configured to cause said selective modification prior to a second integration period of said frame exposure period dependent upon said evaluation.

12. The apparatus of claim 9, wherein said selective modification comprises resetting said photodetector.

13. The apparatus of claim 9, wherein an indication of said selective modification is stored in a memory cell.

14. The apparatus of claim 9, wherein an indication of said selective modification is stored in said light meter.

15. A method comprising:
approximating an initial exposure of a plurality of photodetector included in an image sensor, by a single reference common to said plurality of photodetectors, at an end of a first integration period of a frame exposure period;
resetting said plurality of photodetectors if said initial exposure exceeds a threshold;
detecting a final exposure of said plurality of photodetectors at an end of a second integration period of said frame exposure period;
adjusting said final exposure if said plurality of photodetectors was reset.

16. The method of claim 15, wherein said approximating said initial exposure further comprises reading a sense node common to of photodetectors, said sense node coupled to said of photodetector through a plurality of respective transfer transistors.

17. The method of claim 15, wherein said first integration period is approximately half of said frame exposure period.

18. The method of claim 15, wherein said plurality of photodetectors includes a first photodetector, a second photodetector, a third photodetector, and a fourth photodetector, wherein said first, second, third and fourth photodetectors are arranged in a Bayer pattern.

* * * * *